United States Patent
Chiang et al.

(10) Patent No.: US 8,723,341 B2
(45) Date of Patent: May 13, 2014

(54) ALIGNMENT MARK AND METHOD OF MANUFACTURING THE SAME

(75) Inventors: Chen Ku Chiang, Taipei (TW); Yuan Hsun Wu, Zhongli (TW)

(73) Assignee: Nan Ya Technology Corporation, Tao-Yuan Hsien (TW)

( * ) Notice: Subject to any disclaimer, the term of this patent is extended or adjusted under 35 U.S.C. 154(b) by 41 days.

(21) Appl. No.: 13/333,272

(22) Filed: Dec. 21, 2011

(65) Prior Publication Data

US 2013/0161841 A1 Jun. 27, 2013

(51) Int. Cl.
*H01L 23/544* (2006.01)

(52) U.S. Cl.
USPC .......................................................... 257/797

(58) Field of Classification Search
USPC .......................................................... 257/797
See application file for complete search history.

(56) References Cited

U.S. PATENT DOCUMENTS

2007/0069400 A1* 3/2007 Tanaka ........................... 257/797
2009/0291513 A1* 11/2009 Ghinovker et al. ............. 438/16

* cited by examiner

*Primary Examiner* — Hoa B Trinh
(74) *Attorney, Agent, or Firm* — Juan Carlos A. Marquez; Morris, Manning & Martin, LLP

(57) ABSTRACT

An alignment mark includes a plurality of mark units. Each mark unit includes a first element and a plurality of second elements. Each second element includes opposite first and second end portions. The plurality of second elements are arranged along a direction. The first element extends adjacent to the first end portions of the plurality of second elements and parallel to the direction of the plurality of second elements.

12 Claims, 8 Drawing Sheets

ALIGNMENT MARK AND METHOD OF MANUFACTURING THE SAME

TECHNICAL FIELD

The present disclosure relates generally to an alignment mark and a method of manufacturing the same, and relates more particularly to an alignment mark used for alignment in lithographic processes and a method of manufacturing the same.

BACKGROUND

In semiconductor fabrication processes, lithographic apparatuses are applied to form desired circuit patterns on substrates. In general, photosensitive resin is coated on a wafer. A lithographic apparatus radiates light on a reticle carrying a circuit layout similar to, but larger than, a desired circuit pattern, transferring the circuit layout to the photosensitive resin on the wafer. Known lithographic apparatuses include so-called steppers, which project light on an entire circuit layout to instantly transfer the circuit layout on a wafer in a shot at every exposure operation, and so-called scanners, which move a reticle and a wafer synchronously to allow a scanning light beam that can illuminate a specific portion of a circuit layout to gradually transfer the circuit layout on a shot area of a wafer at every exposure operation.

It is widely known that the resolution capability of a lithographic apparatus (i.e., the minimum feature that can be printed) can be described by the Rayleigh equation:

$$\text{resolution} = k_1 \frac{\lambda}{\text{numerical aperture}} \quad (1)$$

Equation (1) shows how resolution of a lithographic apparatus can be improved by reduction of the wavelength λ of exposure light. Indeed, the electronic industry has improved resolution by developing lithographic apparatuses based on successively shorter wavelengths: g-line (436 nm), i-line (365 nm), DUV (248 nm), and ArF (193 nm). Similarly, according to Equation (1), resolution can be also improved by creating lithographic apparatuses with larger numerical apertures. In addition, the resolution may be enhanced by optimization of process parameters including illumination settings, mask design and photoresist process. The process parameters can be included in the $k_1$ factor.

Depth-of-focus (DOF) is another important parameter measuring the performance of a lithographic apparatus. DOF can be improved using the immersion technique, alternating phase-shift mask, or off-axis illumination.

Dipole is an off-axis illumination process that provides better aerial image contrast than conventional or annular illumination can provide, in directions perpendicular to the dipole orientation. Specifically, X-dipole illumination gives the best resolution for vertical lines and Y-dipole gives the best resolution for horizontal lines. However, X-dipole does not give good resolution for horizontal lines, and Y-dipole does not give good resolution for vertical lines.

In order to accurately project the circuit layout on a desired position of the wafer, the wafer must be aligned before an exposure operation is performed. To align the wafer, alignment marks have to be formed on the wafer. FIG. 1 illustrates alignment marks 11 and 12 commonly used for alignment in a pitch-doubling process, which usually adopts X-dipole illumination. The alignment marks 11 and 12 can be disposed respectively in scribe lines 13 and 14. The alignment mark 11 may comprise a plurality of first mark elements 111 arrayed along a direction parallel to the x-axis and a plurality of second mark elements 112 also arrayed along a direction parallel to the x-axis. Each second mark element 112 extends along a direction parallel to the y-axis. The major bar elements 111 are formed among the plurality of second mark elements 112. To measure the position of the wafer in the x-axis direction, an illumination spot 15 moves in a direction 16 to illuminate the alignment mark 11 so as to generate detecting signals that are then analyzed to determine the position of the wafer in the x-axis direction.

Similarly, the alignment mark 12 may comprise a plurality of first mark elements 121 arrayed along a direction parallel to the y-axis and a plurality of second mark elements 122 arrayed along a direction parallel to the x-axis. Each second mark element 122 extends along a direction parallel to the y-axis, and the major bar elements 111 are formed among the plurality of second mark elements 122. To measure the position of the wafer in the y-axis direction, an illumination spot 17 moves in a direction 18 to illuminate the alignment mark 12 so as to generate detecting signals that are then analyzed to determine the position of the wafer in the x-axis direction.

In the alignment system shown in FIG. 1, the position in the x-axis direction can be accurately determined while the measured position in the y-axis direction needs an offset for compensation. In the alignment marks 11 and 12, the second mark elements 112 and 122 all extend in directions parallel to the y-axis. Such an arrangement means that the second mark elements 112 extend perpendicular to the scanning direction 16 of the illumination spot 15 as shown in FIG. 2, while the second mark elements 122 extend parallel to the scanning direction 18 as shown in FIG. 3. When the illumination spot 17 scans along the alignment mark 12, the illumination spot 17 may meet the ends of the second mark elements 122. The ends of the second mark elements 122 form an irregular edge profile of the alignment mark 12 that may cause inaccuracy of alignment.

SUMMARY

In some embodiments, an alignment mark may comprise a plurality of mark units. Each mark unit may comprise a first element and a plurality of second elements. Each second element may comprise opposite first and second end portions. The plurality of second elements may be arranged along a direction. The first element may extend adjacent to the first end portions of the plurality of second elements and parallel to the direction of the arrangement of the plurality of second elements.

In some embodiments, an alignment mark may comprise a plurality of mark units. Each mark unit may comprise two first elements and two groups of second elements. The two first elements may extend parallel to each other. The two first elements may extend along a direction. The two first elements may be between the two groups of second elements. Each second element may comprise two opposite end portions. The second elements of each group may be arranged in a direction parallel to the direction of the extension of the two first elements. One of the two opposite end portions may extend adjacent to a corresponding one of the two first elements.

In some embodiments, a method of manufacturing an alignment mark may comprise forming, on a substrate, a pattern comprising a connecting member and a plurality of lines extending from a side of the connecting member, forming spacers on side walls of the pattern, removing the pattern, and etching the substrate using the spacers to form a mark unit of the alignment mark.

The foregoing has outlined rather broadly the features of the present invention in order that the detailed description of the invention that follows may be better understood. Additional features of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

DETAILED DESCRIPTION

Figure 1:
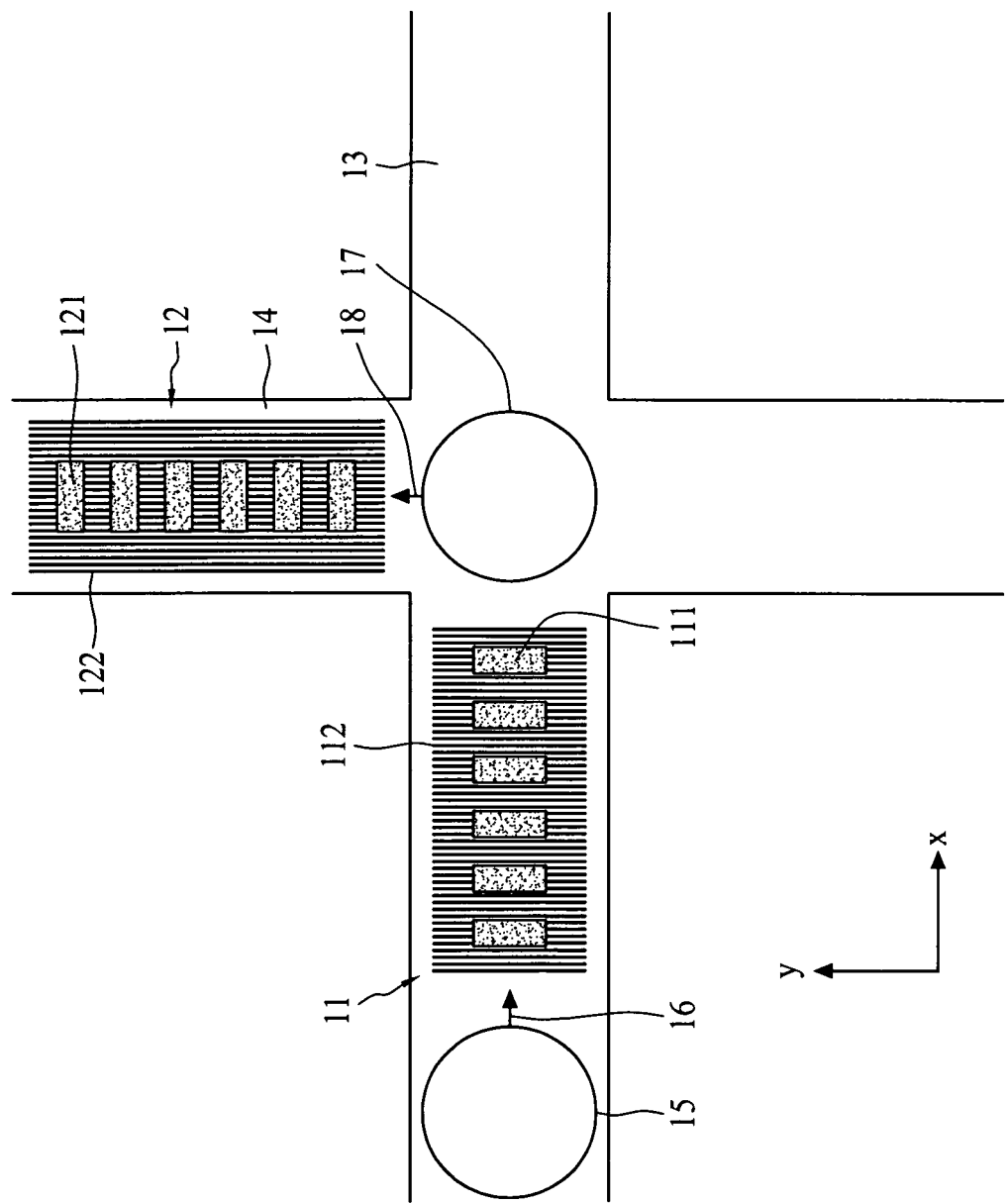
FIG. 1 illustrates commonly used alignment marks.
Figure 2:
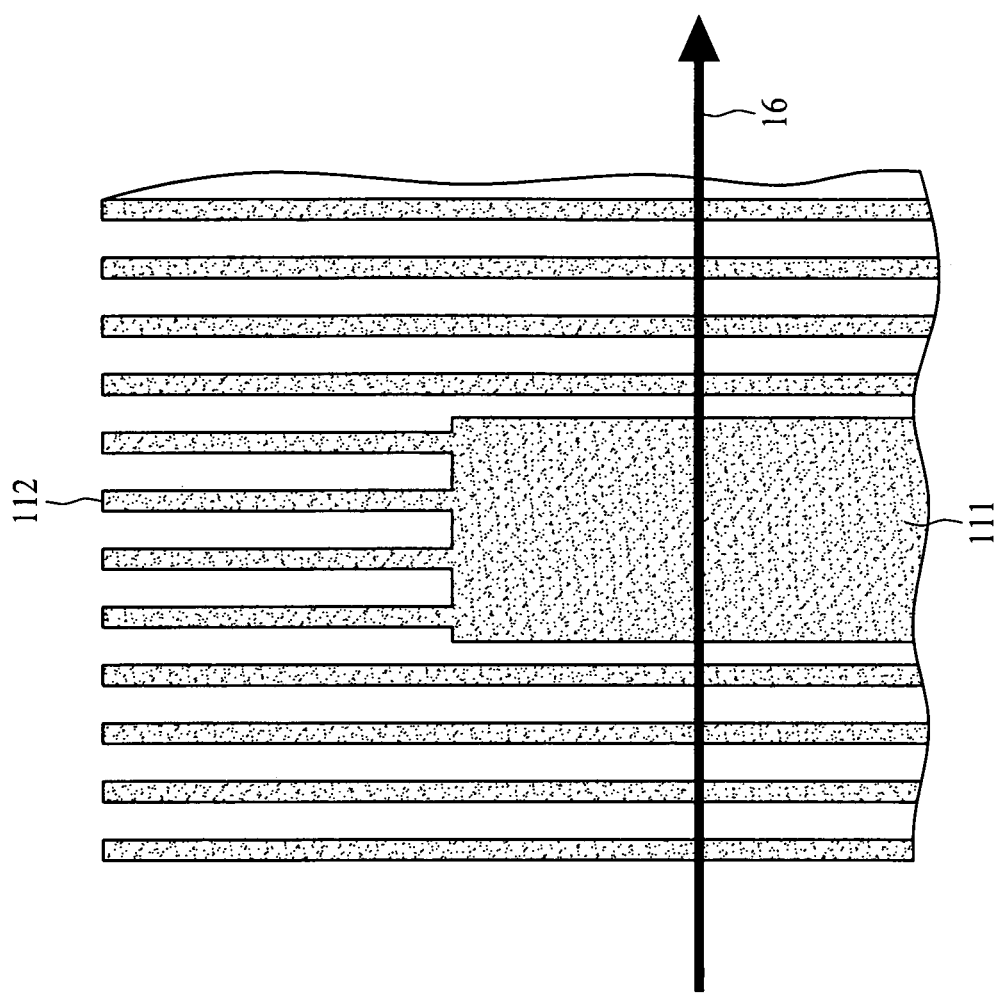
FIG. 2 shows a portion of one alignment mark of FIG. 1.
Figure 3:
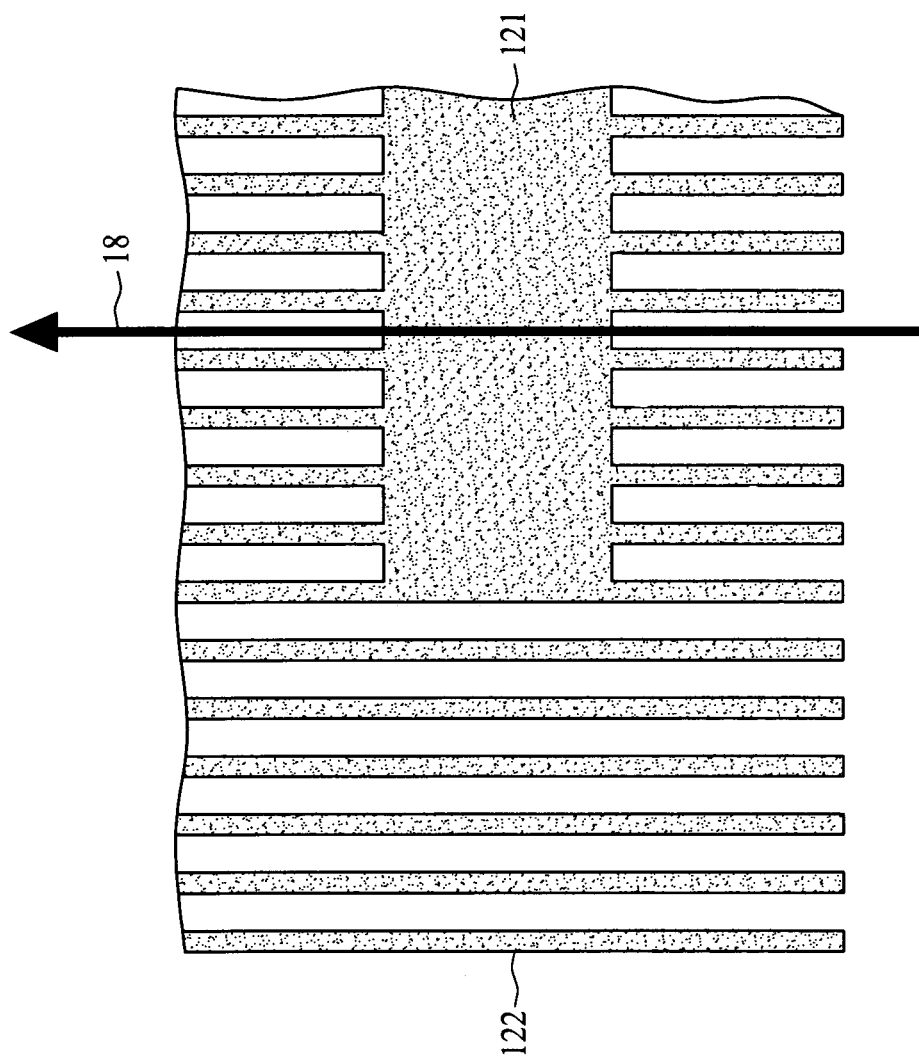
FIG. 3 shows a portion of another alignment mark of FIG. 1.
Figure 4:
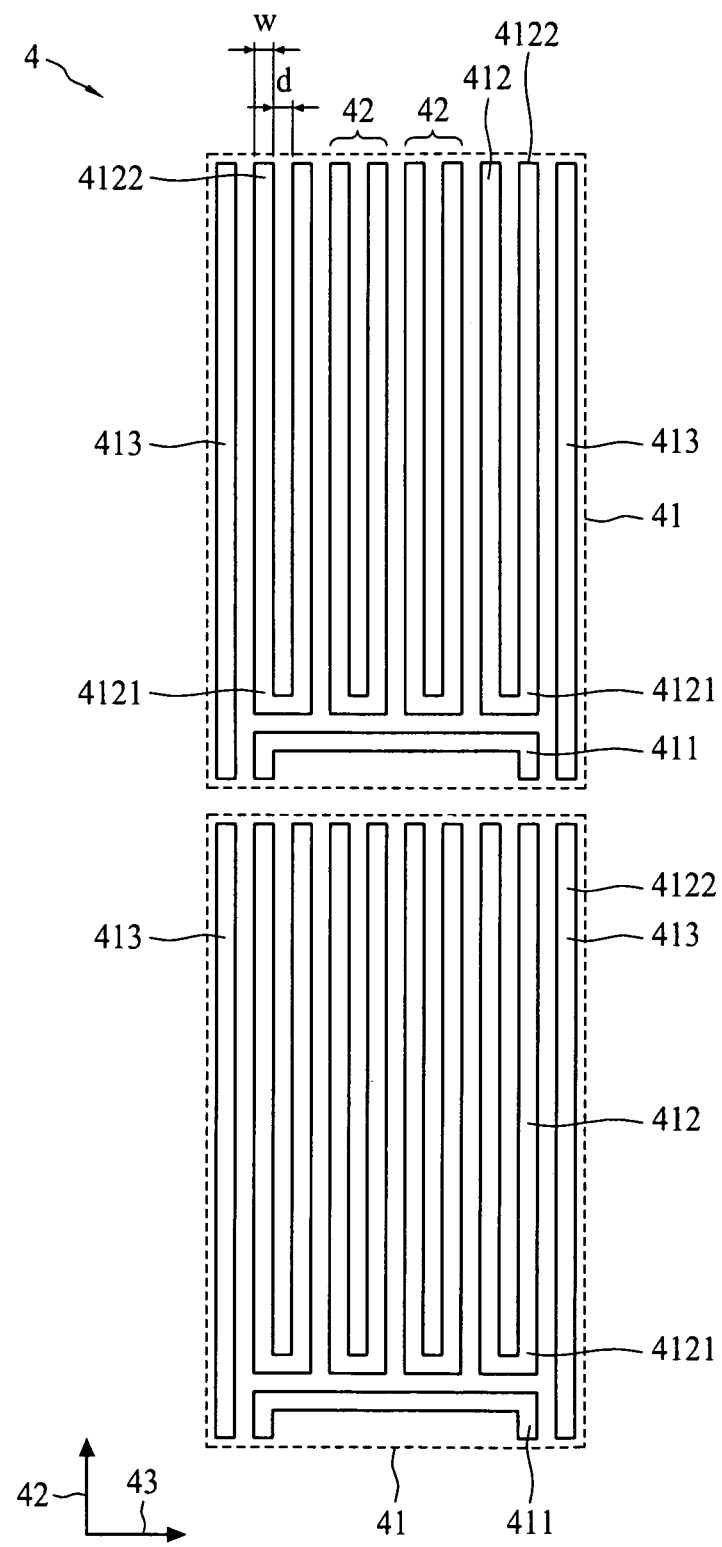
FIG. 4 is a view showing an alignment mark according to one embodiment of the present invention.

FIG. 4 is a view showing an alignment mark 4 according to one embodiment of the present invention. As shown in FIG. 4, the alignment mark 4 may be used with, but is not limited to, lithographic apparatuses employing off-axis illuminations such as X-dipole illumination, Y-dipole illumination, and a quadrupole illumination. The alignment mark 4 may comprise a plurality of mark units 41 arranged along a direction parallel to a direction 42 that can be, for example, a mark scanning direction. When an illumination spot scans along the alignment mark 4, signals for determining the position of a wafer can be generated.

Each mark unit 41 may comprise a first element 411 and a plurality of second elements 412. The first element 411 can be disposed adjacent to the plurality of second elements 412, and may be separate from the plurality of second elements 412. In some embodiments, the first element 411 may be disposed adjacent to the side of the plurality of second elements 412 being perpendicular to the scanning path and exhibiting an irregular profile.

The plurality of second elements 412 may be arranged along a direction parallel to a direction 43, which may be perpendicular to the scanning direction 42. In some embodiments, the plurality of second elements 412 can be spaced apart by a consistent distance d. In some embodiments, the second element 412 may comprise a width w, which can be equivalent to the distance d. In some embodiments, the plurality of second elements 412 may be arranged to form a grating. In some embodiments, the second element 412 may comprise a bar shape. In some embodiments, the width w of the second element 412 can be on the micro-scale level. In some embodiments, the width w of the second element 412 can be on the nano-scale level.

Each second element 412 may comprise a first end portion 4121 and a second end portion 4122. The first end portion 4121 may be disposed opposite to the second end portion 4122. The plurality of second elements 412 may extend along a direction parallel to the scanning direction 42 such that the first end portions 4121 and the second end portions 4122 of the second elements 412 may be arranged perpendicular to the scanning path.

The first element 411 may extend along a direction parallel to the direction 43. The first element 411 may be formed adjacent to the first end portions 4121 of the plurality of second elements 412, in front of the first end portions 4121 relative to the scanning direction 42. As such, when an illumination spot passes the first end portions 4121 of the plurality of second elements 412, the first element 411 may reduce the adverse influence of the first end portions 4121 of the plurality of second elements 412 on alignment signals, generating better alignment results. In some embodiments, the first element 411 may have a bar-like shape. In some embodiments, the first element 411 may be C-shaped.

In some embodiments, the alignment mark 4 can be employed with a lithographic apparatus adopting X-dipole illumination, and the direction 42 may be the y-axis direction. In some embodiments, the alignment mark 4 can be employed with a lithographic apparatus adopting Y-dipole illumination, and the direction 42 may be the x-axis direction.

In some embodiments, the plurality of second elements 412 can be separated from each other. In some embodiments, in each mark unit 41, the plurality of second elements 412 can be arranged into a plurality of pairs 42, and the second elements 412 of each pair 42 are connected at their first end portions 4121. The connected first end portions 4121 of the second elements 412 of each pair 4 can further reduce the adverse influence of the first end portions 4121 of the plurality of second elements 412 on alignment signals, resulting in better alignment.

In some embodiments, the mark unit 41 may further comprise two third elements 413, between which the plurality of second elements 412 are disposed. The two third elements 413 may be formed at two opposite sides of the mark unit 41, configured to define the mark unit 41.

Figure 5:
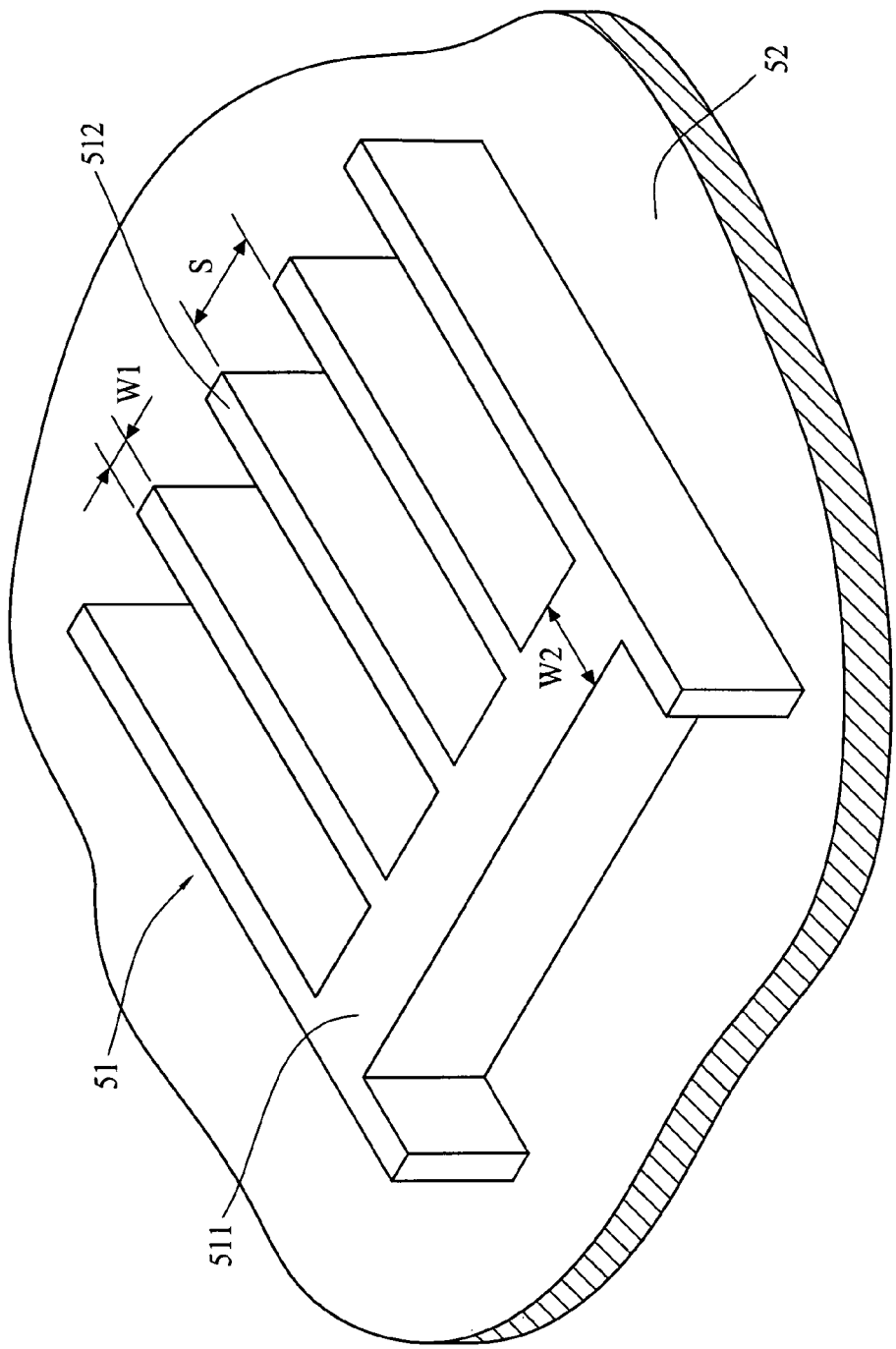
FIGS. 5 to 7 are perspective views employed for demonstrating the steps of a method of manufacturing an alignment mark according to one embodiment of the present invention.
Figure 6:
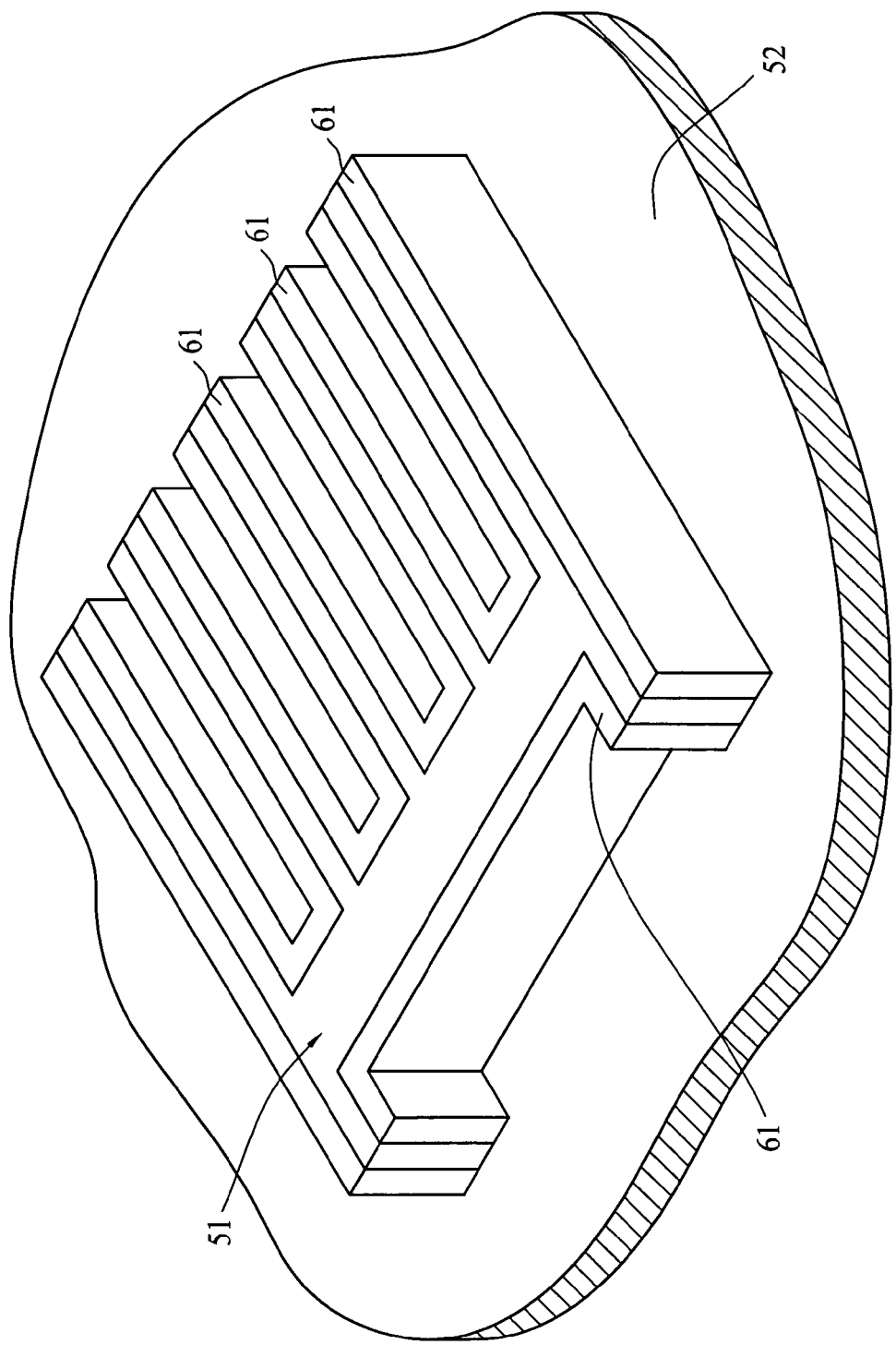
Figure 7:
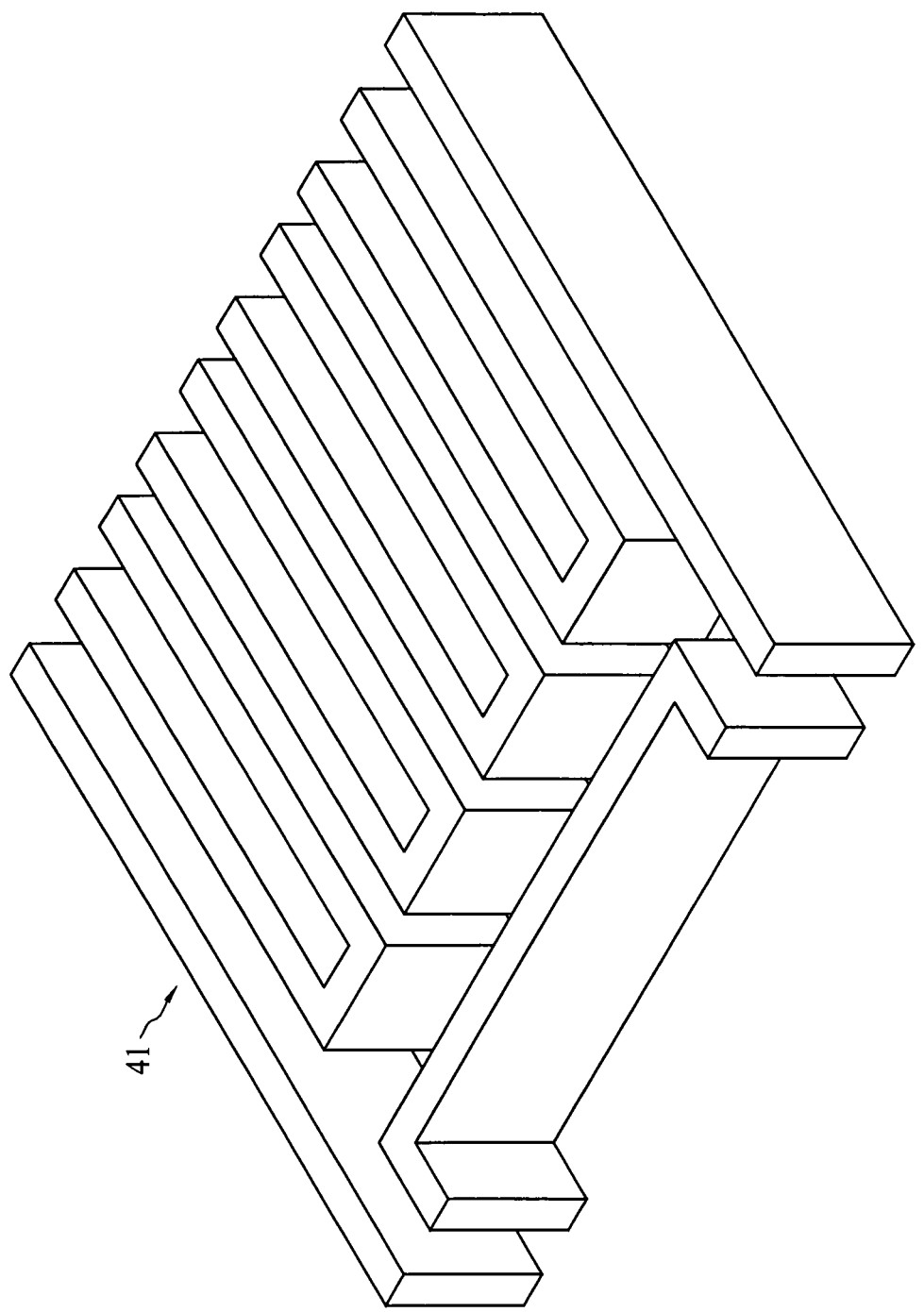

FIGS. 5 to 7 are perspective views employed for demonstrating the steps of a method of manufacturing an alignment mark 4 according to one embodiment of the present invention. For simplification, FIGS. 5 to 7 show the manufacturing process for only one mark unit 41 of an alignment mark 4. The same manufacturing process can be applied to manufacture a complete alignment mark 4. As shown in FIG. 5, a pattern 51 is formed on a substrate 52. In some embodiments, the pattern 51 is formed on a scribe line. In some embodiments, the pattern 51 is formed on a location other than a scribe line. In some embodiments, the pattern 51 may comprise photoresist. In some embodiments, the pattern 51 can be formed by a photolithographic process.

The pattern 51 may comprise a connecting member 511 and a plurality of lines 512. The connecting member 511 has a side from which the plurality of lines 512 extend, as shown in FIG. 5. The plurality of lines 512 may be equally spaced. In some embodiments, the ratio of a width w1 of lines 512 and a width s of the spaces between the lines 512 is approximately 1:3. In some embodiments, the width w2 of the connecting member 511 is greater than the width w1 of lines 512.

Referring to FIG. 6, spacers 61 are formed on the side walls of the pattern 51. Spacer material can be deposited using, for example, an atomic layer deposition process. Spacer material can be deposited using other deposition methods. Spacer material may comprise oxide. The spacers 61 are formed by depositing spacer material onto the pattern 51, and a material removal process such as etching is then applied to remove the spacer material on the horizontal surfaces, leaving the spacer material on side walls of the pattern 51. In some embodiments, the spacer material can be a hard mask material.

Referring to FIGS. 6 and 7, after the spacers 61 are formed, the pattern 51 is removed. Next, the image of the spacers 61 is transferred to the substrate 52 by an etch process. The alignment mark 4 is then completed.

Figure 8:
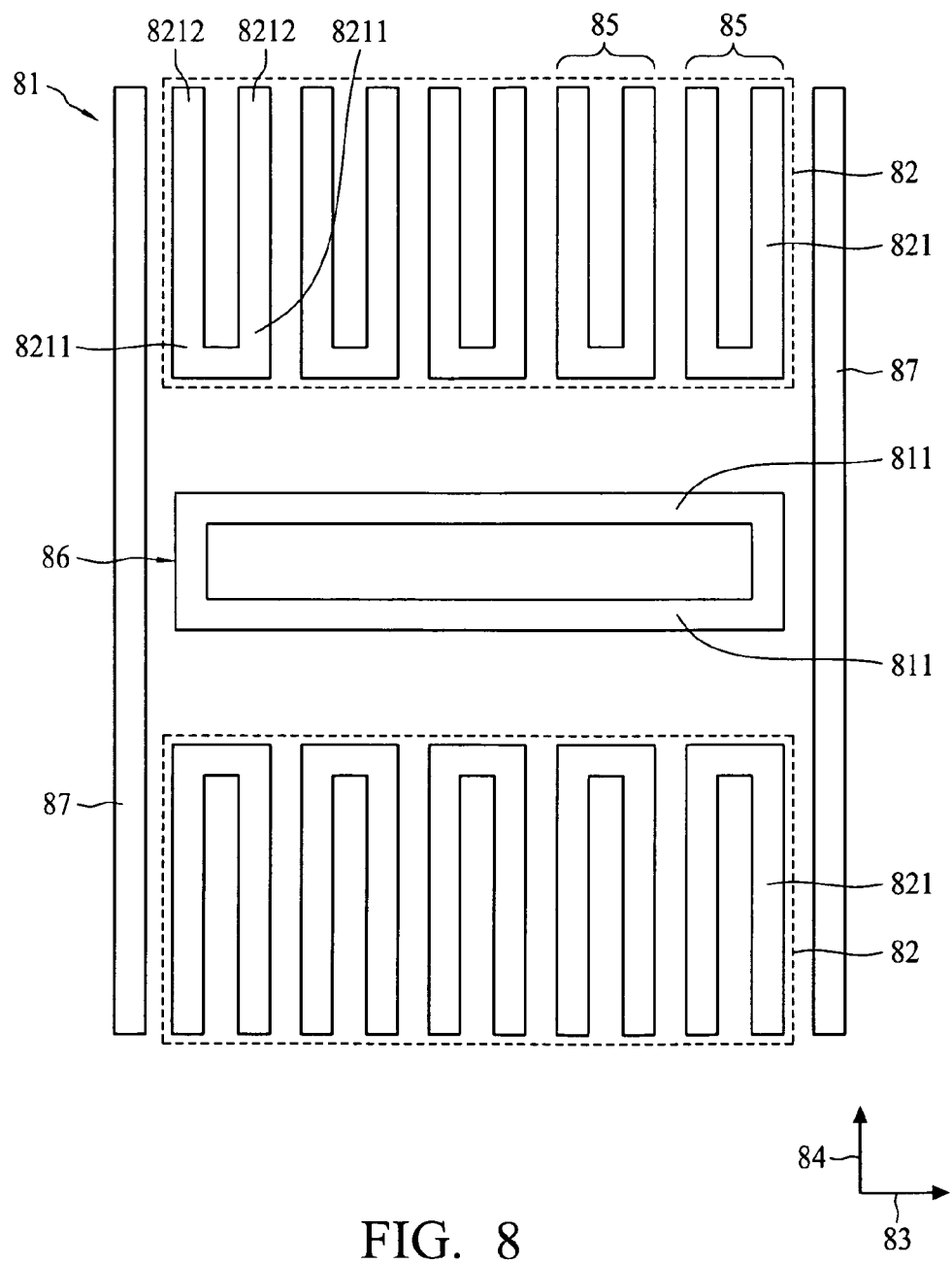
FIG. 8 is a top view showing a mark unit of an alignment mark according to another embodiment of the present invention.

FIG. 8 is a top view showing a mark unit 81 of an alignment mark according to another embodiment of the present invention. The alignment mark may comprise one or more mark units 81. Referring to FIG. 8, the mark unit 81 may comprise two first elements 811 and two groups 82 of second elements 821. The two first elements 811 may extend parallel to each other. The two first elements 811 may extend along a direction 83. The two first elements 811 may be disposed between the two groups 82 of second elements 821.

In each group 82, the second elements 821 may be arrayed along a direction parallel to the direction 83. Each second element 821 may extend along a direction 84 that may be perpendicular to the direction 83. The second elements 821 may have similar widths. The second elements 821 may be spaced equally by a distance that may be substantially equivalent to the width of the second element 821. In some embodiments, the second elements 821 may form a grating. In some embodiments, the second elements 821 may be separate.

Each second element 821 may comprise two opposite end portions 8211 and 8212. The second elements 821 of each group 82 can be separate from each other, and can be arranged along the direction 83. Each first element 811 may be disposed adjacent to the end portions 8211 of the corresponding second element 821 that are arranged perpendicular to an alignment scanning path so that the adverse influence of the end portions 8211 of the second elements 821 on alignment signals can be reduced.

As shown in FIG. 8, the second elements 821 of each group 82 may be arranged into a plurality of pairs 85. The end portions 8211 of the second elements 821 of each pair 85, adjacent to the corresponding first element 811, can be connected such that the adverse influence of the end portions 8211 of the second elements 821 on alignment signals can be further reduced.

In some embodiments, the mark unit 81 may comprise a frame member 86, which can be between two groups 82 of second elements 821 and can comprise the two first elements 811. In some embodiments, the width of the frame member may be equivalent to the width of the second member 821.

As shown in FIG. 8, the mark unit 81 may further comprise two third elements 87. The groups 82 of second elements 821 may be between the two third elements 87. The two third elements 87 can be located at two opposite sides of the mark unit 81, defining the mark unit 81.

Although the present invention and its objectives have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An alignment mark comprising a plurality of mark units each comprising a first element and a plurality of second elements each comprising opposite first and second end portions, wherein the plurality of second elements are arranged along a direction, and the first element extends adjacent to the first end portions of the plurality of second elements and parallel to the direction of the arrangement of the plurality of second elements, wherein in each mark unit the plurality of second elements are arranged into a plurality of pairs of second elements, and the second elements of each pair are connected at their first end portions.

2. The alignment mark of claim 1, wherein in each mark unit the plurality of second elements form a grating.

3. The alignment mark of claim 1, wherein in each mark unit the plurality of second elements are spaced by a distance.

4. The alignment mark of claim 1, wherein each second element comprises a bar shape and extends perpendicular to the direction of the arrangement of the plurality of second elements.

5. The alignment mark of claim 1, wherein each mark unit further comprises two third elements disposed on opposite sides of the mark unit.

6. An alignment mark comprising a plurality of mark units each comprising:
    two first elements extending parallel to each other and along a direction; and
    two groups of second elements each comprising opposite first and second end portions, wherein the two first elements are between the two groups of second elements, and the second elements of each group are arranged in a direction parallel to the direction of the extension of the two first elements with one of corresponding opposite first and second end portions of each second element extending adjacent to a corresponding one of the two first elements, and corresponding ones of the second elements are connected at their first end portions.

7. The alignment mark of claim 6, wherein the second elements of each group are arranged into a plurality of pairs of second elements, and the second elements of each pair are connected at the end portions adjacent to a corresponding one of the two first elements.

8. The alignment mark of claim 6, wherein each mark unit comprises a rectangular frame member comprising the first elements.

9. The alignment mark of claim 6, wherein the second elements of each group form a grating.

10. The alignment mark of claim 6, wherein the second elements of each group are spaced by a distance.

11. The alignment mark of claim 6, wherein the second element of each group comprises a bar shape and extends perpendicular to the direction of the extension of the two first elements.

12. The alignment mark of claim 6, wherein each mark unit further comprises two third elements disposed on opposite sides of the mark unit.

* * * * *